US005198674A

United States Patent [19]

Underwood

[11] Patent Number: 5,198,674

[45] Date of Patent: Mar. 30, 1993

[54] PARTICLE BEAM GENERATOR USING A RADIOACTIVE SOURCE

[75] Inventor: David G. Underwood, Naperville, Ill.

[73] Assignee: The United States of America as represented by the United States Department of Energy, Washington, D.C.

[21] Appl. No.: 798,782

[22] Filed: Nov. 27, 1991

[51] Int. Cl.[5] ............ H01J 37/14

[52] U.S. Cl. ............ 250/396 ML; 250/396 R

[58] Field of Search ........... 250/308, 396 R, 396 ML, 250/492.3

[56] References Cited

U.S. PATENT DOCUMENTS

| | | | |
|---|---|---|---|
| 3,202,817 | 8/1965 | Belbeoch | 250/396 ML |
| 3,659,095 | 4/1972 | Gumenjuk et al. | 250/396 ML |
| 4,191,887 | 3/1980 | Brown | 250/396 ML |
| 4,355,236 | 10/1982 | Holsinger | 250/396 ML |
| 4,389,572 | 6/1983 | Hutcheon | 250/396 R |
| 4,409,486 | 10/1983 | Bates | 250/396 ML |
| 4,429,229 | 1/1984 | Gluckstern | 250/396 ML |
| 4,710,722 | 12/1987 | Jahnke | 250/396 ML |
| 4,726,046 | 2/1988 | Nunan | 378/65 |
| 4,870,287 | 9/1989 | Cole et al. | 250/492.3 |

OTHER PUBLICATIONS

Steffen, Klaus g., "Composite Systems & Spectrometers—Nondispersive Deflecting Systems", High Energy Beam Optics, 1965, pp. 113-124.

Halbach, "Application of Permanent Magnets in Accelerators and Electron Storage Rings", J. Appl. Phys. 57, 1985, pp. 3605-3608.

*Primary Examiner*—Bruce C. Anderson

*Attorney, Agent, or Firm*—Helen S. Cordell; Robert J. Fisher; William R. Moser

[57] ABSTRACT

The apparatus of the present invention selects from particles emitted by a radioactive source those particles having momentum within a desired range and focuses the selected particles in a beam having at least one narrow cross-dimension, and at the same time attenuates potentially disruptive gamma rays and low energy particles. Two major components of the present invention are an achromatic bending and focusing system, which includes sector magnets and quadrupole, and a quadrupole doublet final focus system. Permanent magnets utilized in the apparatus are constructed of a ceramic (ferrite) material which is inexpensive and easily machined.

13 Claims, 3 Drawing Sheets

PARTICLE BEAM GENERATOR USING A RADIOACTIVE SOURCE

CONTRACTUAL ORIGIN OF THE INVENTION

The U.S. Government has rights in this invention pursuant to Contract No. W-31-109-ENG-38 between the U.S. Department of Energy and the University of Chicago.

BACKGROUND OF THE INVENTION

This invention relates generally to a particle beam generator, and in particular to an apparatus which uses a radioactive source to generate a continuous focused monoenergetic electron beam.

Some measurements, calibrations, and physics experiments require an electron beam with high energy and narrow width, as well as sufficient flux to allow particle by particle pulse measurement. Backgrounds such as gamma rays and low energy electrons which could interfere with time coincidences on electrons must be eliminated.

Particle accelerators of the prior art which rely on electrical acceleration and electromagnetic focusing require expensive power supplies and maintenance, including adjustment and regulation of several power supplies during operation.

Collimators of the prior art when used in conjunction with radioactive sources typically produce a narrowed beam by channeling particles emitted in a forward direction. Because particles are selected from a relatively narrow solid angle significant numbers of particles at the energy of interest are eliminated. The resultant collimated beam is generally unfocused and is comprised of particles at all energy levels emitted by the source. In addition, gamma rays are not attenuated in the forward direction.

Principals of momentum selection through dispersion are known to the prior art (see Steffen, Klaus G., "Composite Systems & Spectrometers-Nondispersive Deflecting Systems", *High Energy Beam Optics,* 1965, pp. 113–117) and have been applied to accelerator generated particle beams (see U.S. Pat. No. 4,726,046, Nunan).

However, no single instrument of the prior art uses a radioactive source and efficiently combines functions of momentum selection through dispersion with means for demagnification to produce a focused monoenergetic particle beam.

It is therefore primary object of this invention to provide an apparatus for generation of a particle beam with high energy and flux, which eliminates or greatly reduces the amount of electrical power required and is inexpensive to construct and to operate when compared to particle beam accelerators of the prior art.

In the accomplishment of the foregoing object, it is another important object of this invention to provide an apparatus which uses a radioactive source to generate a monoenergetic electron beam of high energy and flux, while attenuating gamma rays and low energy electrons.

It is another important object of this invention to provide an apparatus which demagnifies an electron beam derived from a radioactive source, and focuses the electron beam to a spot with at least one narrow cross-dimension.

It is a further object of this invention to present an apparatus which requires no adjustment during operation.

A yet further object of the present invention is to present an apparatus which selects from particles emitted from a radioactive source those having momentum within a desired range and focuses the resultant beam to a narrow spot.

It is also an object of the present invention to provide a beam transport apparatus which eliminates bulky and expensive electromagnets and incorporates inexpensive and easily worked ceramic magnet material into permanent dipole and quadrupole magnet systems.

Additional objects, advantages and novel features of the invention will become apparent to those skilled in the art upon examination of the following and by practice of the invention.

SUMMARY OF THE INVENTION

To achieve the foregoing and other objects, this invention comprises an apparatus which selects from particles emitted from a radioactive source those particles having momentum within a desired range, and focuses those particles in a beam having at least one narrow cross-dimension, while attenuating gamma rays and particles with momentum outside of the desired range.

The apparatus uses permanent magnets configured in two dipole and quadrupole magnet systems —an achromatic bending and focusing system, and a final focus system.

BRIEF DESCRIPTION OF THE DRAWINGS

The present invention is illustrated in the accompanying drawings where.

DETAILED DESCRIPTION OF THE INVENTION

Figure 1:
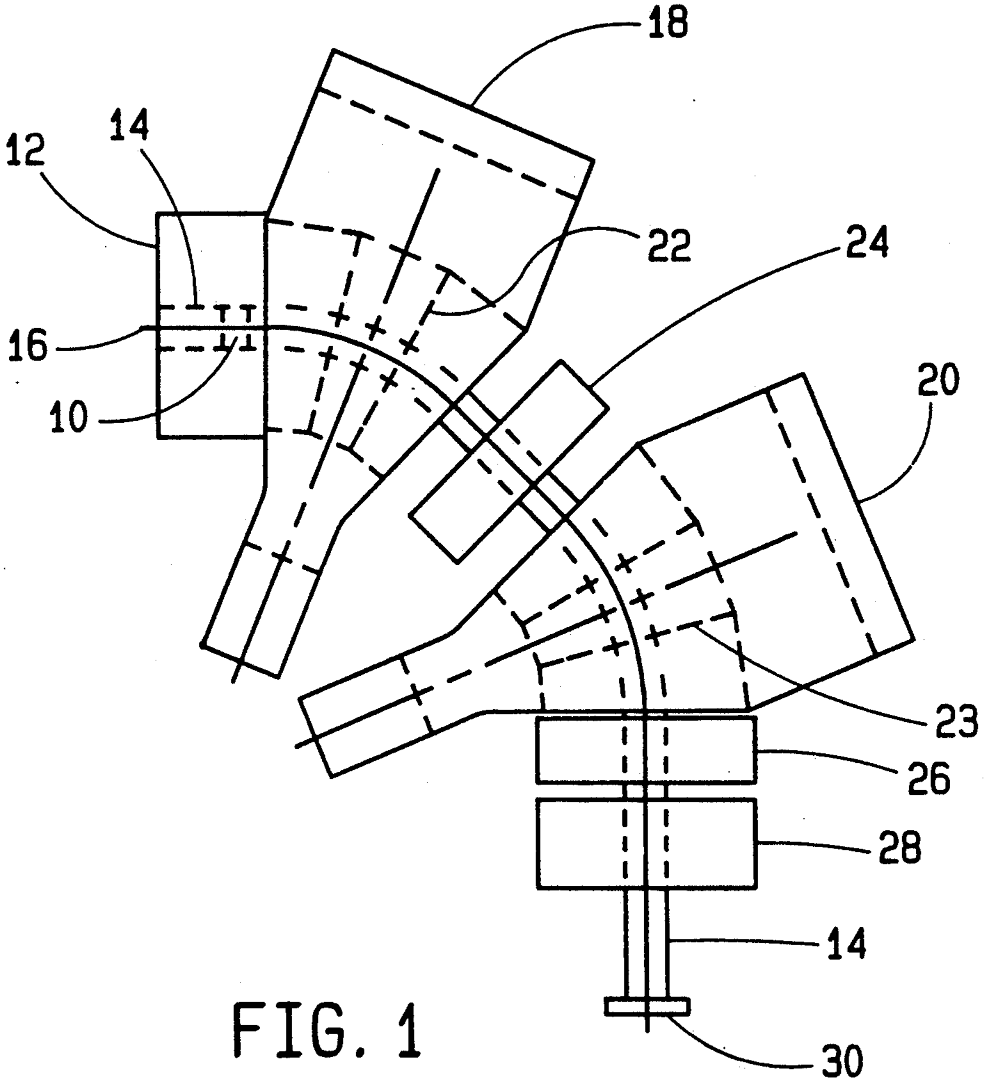
FIG. 1 is a schematic drawing depicting the magnet systems which comprise the present invention.

FIG. 1 is a schematic drawing depicting two dipole and quadrupole magnet systems which are principal elements of the present invention. An achromatic bending and focusing system is comprised of dipoles 18 and 20, and quadrupole singlet 24. A final focus system is comprised of quadrupoles 26 and 28.

Radioactive source 10 is fixed in source holder 12 and has a common axis with beam tube 14. The longitudinal position of source 10 in tube 14 is at the focal point of the achromatic system.

In the preferred embodiment of the present invention, beam tube 14 is brass, with an inside diameter of 9.5 mm.; a vacuum is maintained within tube 14. Radioactive source 10 is 2 milli-Curi of $Ru^{106}$, with a diameter of 5 mm. $Ru^{106}$ is preferred because it emits electrons in a range of energy from 0 to 3.5 MeV. Those skilled in the art will recognize that in alternate embodiments other suitable radioactive sources may be used and some may be used with low density beam transport gases such as helium.

Beam 16 enters the achromatic bending and focusing system through dipole 18, which is equivalent in its dimensions to dipole 20. Dipole 18 disperses beam 16, and gamma rays and low-energy particles are variously attenuated and absorbed in brass within tube 14 and surrounding lead (not shown), making beam 16 monoenergetic. Selected particles proceed through quadrupole 24 and are focussed to proceed through dipole 20 for momentum recombination and intermediate focus, and subsequent focusing by quadrupoles 26 and 28.

Dipoles 18 and 20 are 45 degree sectors; in the preferred embodiment for ease of construction beam 16 is bent a total of 90 degrees, and the resultant magnetic field is symmetric about quadrupole 24. In this configuration, the achromatic system has two focal points —one at the center of the beam entering dipole 18 and one at the center of the beam exiting dipole 20. In other embodiments using alternate bending angles the positions of focal points will vary.

Figure 2:
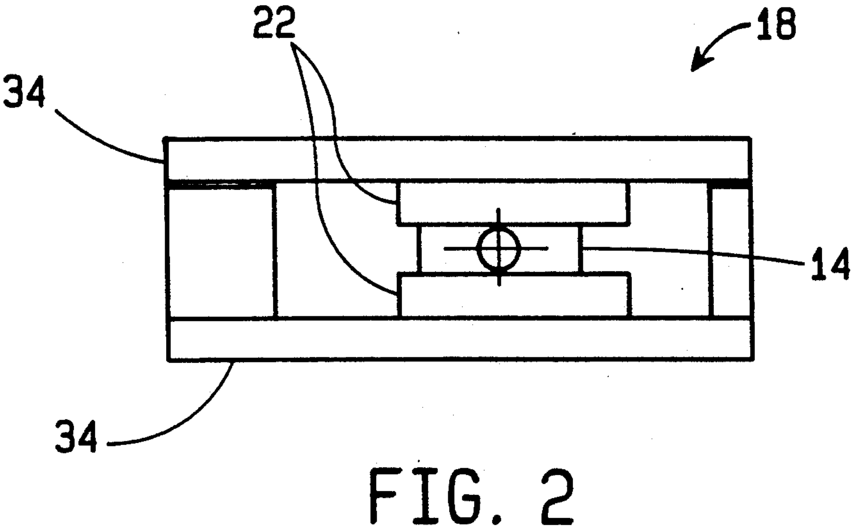
FIG. 2 is a partial schematic section in cross section of sector dipole included in the magnet systems of FIG. 1.

Dipole 1 (equivalent in dimensions to dipole 20) is depicted in the partial schematic section in cross section in FIG. 2. Dipole 18 is comprised of magnetic pole tips 22 and iron flux returns 34, and has a field of approximately 1.7 kG. Dipoles 18 and 20 are distinguishable from prior art in that pole tips 22 are permanent magnets, comprised ceramic (ferrite) material which is relatively inexpensive and easily machined. Additionally, dipoles 18 and 20 have no iron at their pole faces, which strengthens their fields while providing acceptable uniformity.

Figure 3:
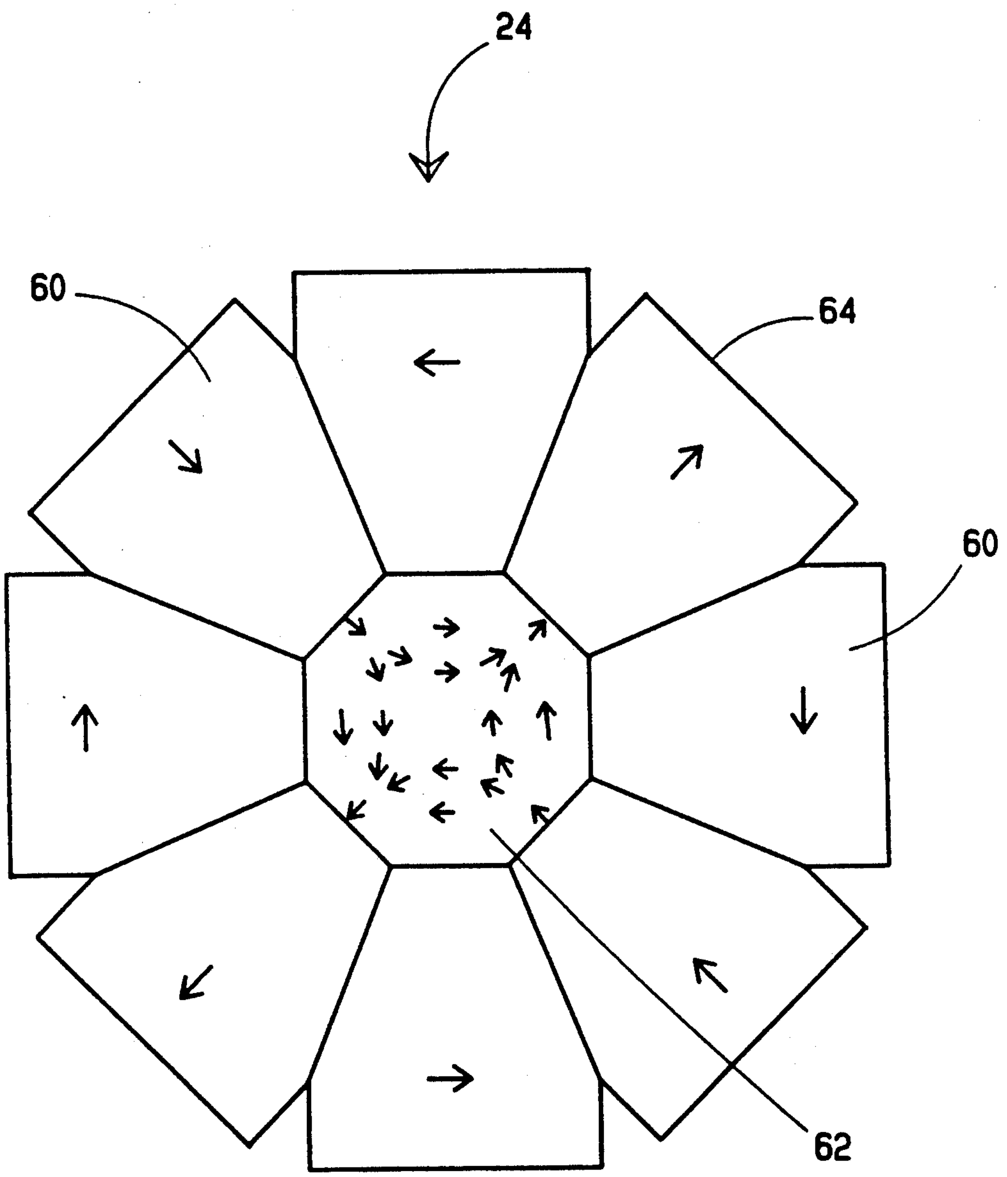
FIG. 3 is a schematic section in cross section of a quadrupole included in the magnet systems of FIG. 1.

Quadrupole 24 which is depicted in schematic section in side view in FIG. 3 is constructed of eight modified truncated wedge permanent magnet sectors 60, again using ceramic ferrite) material. No iron is used in quadrupole 24. Each of sectors 60 has an inner radius of 0.5 cm, an outer radius of 1.5 cm, and a length of 0.96 cm. The construction of sectors 60 is simpler and the quality of field 62 is adequate if the easy axis of each sector 60 is parallel or orthogonal to the face 64 of sector 60. The number of sectors in each quadrupole and the easy axis orientation of each permanent magnet sector may be optimized for a given magnet material and desired aperture by applying principles known in prior art (see Halbach, "Application of Permanent Magnets in Accelerators and Electron Storage Rings," *J. Appl. Phys.* 57, 1985, pp. 3605-8.).

Particles selected by dipole 20 enter the final focusing section comprised of quadrupoles 26 and 28, shown in FIG. 1, which have radii equal to those of quadrupole 24 and lengths of 0.96 and 1.5 cm respectively. Quadrupoles 26 and 28 focus beam 16 from a point within the curvature of the latter 45 degree bend to a final focus where the beam is utilized.

Figure 4:
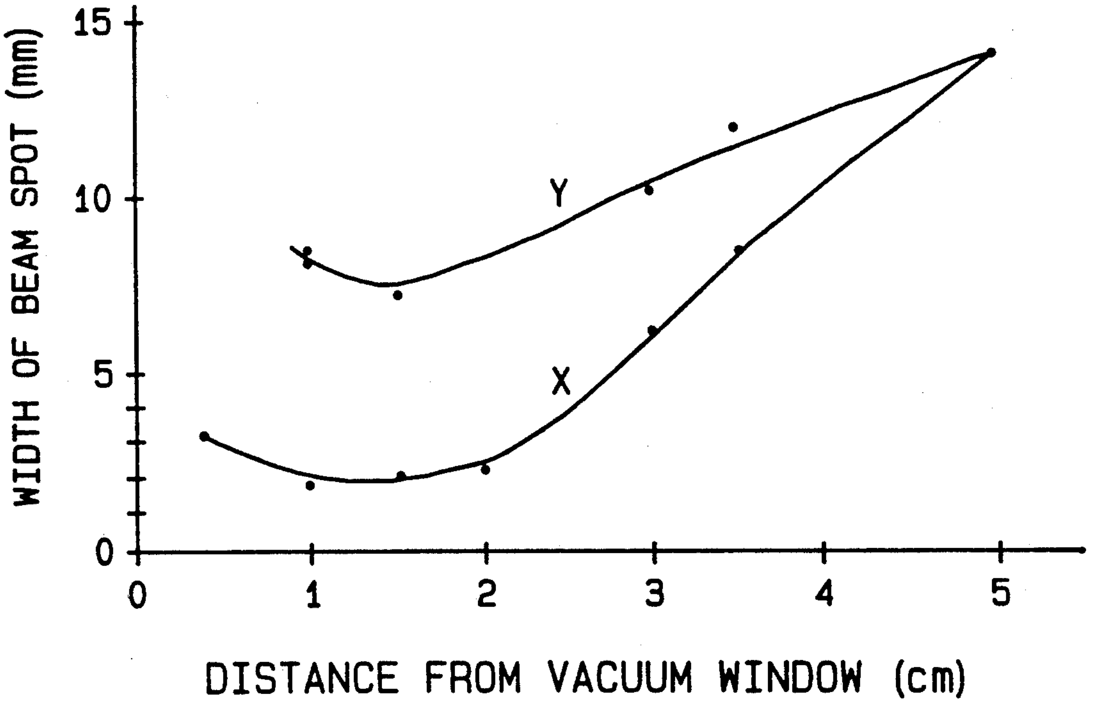
FIG. 4 is a graph depicting the width and height of the generated particle beam as a function of distance downstream from the exit window.

One cross-dimension of beam 16 is reduced as it passes through quadrupoles 26 and 28 without significant loss of flux. In first order linear optics, the demagnification would be simply related to the focal length of quadrupoles 26 and 28, the focal length of the achromatic section, and the position of quadrupoles 26 and 28, however the doublet is not achromatic and allowance must be made for momentum spread. FIG. 4 is a plot of the width and height of beam 16 as a function of distance downstream from window 30. In the horizontal plane beam 16 has a minimum width of 2 mm (at least 95% of the beam) at a point 1 cm from window 30, which is the focal point of the focusing system. Those skilled in the art will recognize that quadrupole triplets may be substituted for singlet 24, for the purpose of reducing more than one cross-dimension of beam 16.

The preferred embodiment of the present invention postulates the need for an electron beam with energy in the range centered at 3.0 MeV with a spread of 9.4% rms and plus or minus 19% maximum, a quadrupole aperture of approximately 1 cm., a 90 degree bend, and permanent magnet material with strength of approximately 2.4 kilogauss B residual. Other parameters of the present invention including the length of each quadrupole, positioning of all elements, dipole gap and field strength, and, within limits, beam energy, were evaluated by using trial and error and well-known beam optical computer techniques, including TRANSPORT, a standard beam design program developed at the Stanford Linear Accelerator Center, Stanford, Calif., (SLAC Report No. 91(1977)). In addition, TURTLE, a standard beam Monte-Carlo program (Fermi National Accelerator Laboratory Report No. 64 (1978)), was used to evaluate several alternate solutions. The foregoing description of a preferred embodiment of the invention has been presented for purposes of illustration and description. It is not intended to be exhaustive or to limit the invention to the precise form disclosed, and obviously many modifications and variations are possible in light of the above teaching. The embodiments described explain the principles of the invention and practical applications and should enable others skilled in the art to utilize the invention in various embodiments and with various modifications as are suited to the particular use contemplated. It is intended that the scope of the invention be defined by the claims appended hereto.

The embodiments of the invention in which an exclusive property or privilege is claimed is defined as follows:

1. An apparatus for generating a charged particle beam using a radioactive source, comprised of:

radioactive source means for producing charged particles having energy of at least 3 MeV, magnet means disposed toward said charged particles for dispersing into an absorber those particles having momentum outside of a predetermined range, magnet means for focusing the resultant particle beam comprised of said charged particles having momentum within the predetermined range, means for attenuating gamma rays from said charged particles, and demagnification means for reducing at least one cross-dimension of said resultant particle beam.

2. The apparatus of claim 1 wherein said magnet means for dispersing from said charged particles those particles having momentum outside of a predetermined range, and said magnet means for focusing the resultant particle beam comprised o said charged particles having momentum within the predetermined range are manufactured of permanent magnet material.

3. The apparatus of claim 2 wherein said magnet means for dispersing from said charged particles those particles having momentum outside of a predetermined range includes achromatic focusing means for reducing chromatic aberrations and minimizing the final spot size.

4. The apparatus of claim 3 wherein said permanent magnet material is ceramic (ferrite) material.

5. The apparatus of claim 4 wherein said resultant particle beam is comprised of electrons in the energy range centered at 3.0 MeV with a spread of 9.4% rms and plus or minus 19% maximum.

6. The apparatus of claim 5 wherein said radioactive source is $Ru^{106}$.

7. The apparatus of claim 6 wherein said magnet means for dispersing charged particles having momentum outside of a predetermined range includes two 45 degree sectors and one quadrupole, each of said sectors bending the path of said beam 45 degrees.

8. The apparatus of claim 7 wherein said final focusing section is comprised of two quadrupoles which focus from a point within the curvature of the latter of said 45 degree bends.

9. The apparatus of claim 7 wherein each of said quadrupoles is comprised of eight hexagonal magnetic sectors, with no iron, and the direction of magnetization of each of said sectors is parallel or orthogonal to the face of said sector.

10. The apparatus of claim 7 wherein said dipoles are sector magnets with permanent magnets on the pole faces.

11. A permanent magnet system for focusing and demagnifying charged particles emitted by a radioactive source, comprised of:

a dipole and quadrupole magnet system for dispersing into an absorber those particles having momentum outside of a predetermined range, a quadrupole doublet for focusing the resultant particle beam comprised of said charged particles having momentum within the predetermined range.

12. The apparatus of claim 11 wherein said dipole and quadrupole magnet system is comprised of two 45 degree sector magnets and one quadrupole generating a symmetric magnetic field.

13. The apparatus of claim 2 wherein said dipoles are sector magnets with permanent magnets on the pole faces.

* * * * *